(12) United States Patent
Haba et al.

(10) Patent No.: US 8,780,576 B2
(45) Date of Patent: Jul. 15, 2014

(54) LOW CTE INTERPOSER

(75) Inventors: Belgacem Haba, Saratoga, CA (US); Kishor Desai, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 320 days.

(21) Appl. No.: 13/232,436

(22) Filed: Sep. 14, 2011

(65) Prior Publication Data

US 2013/0063918 A1 Mar. 14, 2013

(51) Int. Cl.
*H05K 7/00* (2006.01)

(52) U.S. Cl.
USPC ........ 361/783; 361/271; 361/306.3; 361/712; 361/746; 174/254; 174/255; 174/256; 174/258; 174/260; 257/295; 257/692; 257/697; 257/701; 257/723; 257/758; 257/774; 257/778; 428/161; 428/195.1; 438/4; 438/672; 29/831

(58) Field of Classification Search
USPC .............. 361/783, 271, 306.3, 712, 746; 174/254–256, 258, 260; 257/95, 692, 257/697, 701, 723, 758, 774, 778; 428/161, 428/195.1; 438/4, 672; 29/831
See application file for complete search history.

(56) References Cited

U.S. PATENT DOCUMENTS

| | | | | |
|---|---|---|---|---|
| 6,399,891 | B1 * | 6/2002 | Kurita et al. | 174/256 |
| 6,617,690 | B1 * | 9/2003 | Gates et al. | 257/758 |
| 6,963,098 | B2 * | 11/2005 | Daughton et al. | 257/295 |
| 8,299,366 | B2 * | 10/2012 | Sato et al. | 174/260 |
| 2002/0000658 | A1 * | 1/2002 | Kuwabara et al. | 257/737 |
| 2002/0148639 | A1 * | 10/2002 | Smith et al. | 174/255 |
| 2004/0239349 | A1 * | 12/2004 | Yamagishi et al. | 324/754 |
| 2004/0257749 | A1 * | 12/2004 | Otsuka et al. | 361/306.3 |
| 2005/0133929 | A1 * | 6/2005 | Howard | 257/774 |
| 2005/0133930 | A1 * | 6/2005 | Savastisuk et al. | 257/774 |
| 2006/0043567 | A1 * | 3/2006 | Palanduz | 257/697 |
| 2006/0255816 | A1 * | 11/2006 | Shioga et al. | 324/754 |
| 2006/0255817 | A1 * | 11/2006 | Yamagishi | 324/754 |
| 2007/0048896 | A1 | 3/2007 | Andry et al. | |
| 2007/0194437 | A1 * | 8/2007 | Palanduz | 257/701 |
| 2008/0036061 | A1 | 2/2008 | Chainer | |
| 2008/0284037 | A1 * | 11/2008 | Andry et al. | 257/774 |

(Continued)

FOREIGN PATENT DOCUMENTS

EP 0171662 A2 2/1986

OTHER PUBLICATIONS

International Search Report and Writen Opinion, PCT/US2012/055431, dated Jan. 25, 2013.

*Primary Examiner* — Xiaoliang Chen
(74) *Attorney, Agent, or Firm* — Lerner, David, Littenberg, Krumholz & Mentlik, LLP

(57) ABSTRACT

An interconnection component includes a first support portion has a plurality of first conductive vias extending therethrough substantially perpendicular to surfaces thereof such that each via has a first end adjacent a first surface and a second end adjacent a second surface. A second support portion has a plurality of second conductive vias extending therethrough substantially perpendicular to surfaces thereof such that each via has a first end adjacent the first surface and a second end adjacent the second surface. A redistribution layer is disposed between the second surfaces of the first and second support portions, electrically connecting at least some of the first vias with at least some of the second vias. The first and second support portions can have a coefficient of thermal expansion ("CTE") of less than 12 parts per million per degree, Celsius ("ppm/° C.").

29 Claims, 9 Drawing Sheets

(56) References Cited

U.S. PATENT DOCUMENTS

| | | | |
|---|---|---|---|
| 2009/0046441 A1* | 2/2009 | Funaya et al. | 361/783 |
| 2009/0200662 A1* | 8/2009 | Ng et al. | 257/723 |
| 2009/0233047 A1* | 9/2009 | Palanduz | 428/137 |
| 2010/0276796 A1* | 11/2010 | Andry et al. | 257/692 |
| 2011/0024167 A1* | 2/2011 | Hashimoto | 174/258 |
| 2011/0073358 A1* | 3/2011 | Hayashi | 174/258 |
| 2011/0074046 A1* | 3/2011 | Sunohara et al. | 257/778 |
| 2011/0120754 A1* | 5/2011 | Kondo et al. | 174/254 |
| 2011/0126408 A1* | 6/2011 | Antesberger et al. | 29/831 |
| 2011/0127664 A1* | 6/2011 | Antesberger et al. | 257/692 |
| 2011/0133342 A1* | 6/2011 | Arai | 257/774 |
| 2011/0169133 A1* | 7/2011 | Arai | 257/532 |
| 2011/0171756 A1* | 7/2011 | Andry et al. | 438/4 |
| 2012/0024582 A1* | 2/2012 | Maeda et al. | 174/258 |
| 2012/0189818 A1* | 7/2012 | Hayashi | 428/161 |
| 2012/0189826 A1* | 7/2012 | Hayashi | 428/195.1 |
| 2012/0201006 A1* | 8/2012 | Markovich et al. | 361/712 |
| 2013/0003319 A1* | 1/2013 | Malatkar et al. | 361/746 |
| 2013/0015585 A1* | 1/2013 | Kosenko et al. | 257/774 |
| 2013/0237055 A1* | 9/2013 | Funaya et al. | 438/672 |

* cited by examiner

LOW CTE INTERPOSER

BACKGROUND OF THE INVENTION

Interconnection components, such as interposers are used in electronic assemblies to facilitate connection between components with different connection configurations or to provide needed spacing between components in a microelectronic assembly. Interposers can include a dielectric element in the form of a sheet or layer of dielectric material having numerous conductive traces extending on or within the sheet or layer. The traces can be provided in one level or in multiple levels throughout a single dielectric layer, separated by portions of dielectric material within the layer. The interposer can also include conductive elements such as conductive vias extending through the layer of dielectric material to interconnect traces in different levels. Some interposers are used as components of microelectronic assemblies. Microelectronic assemblies generally include one or more packaged microelectronic elements such as one or more semiconductor chips mounted on a substrate. The conductive elements of the interposer can include the conductive traces and terminals that can be used for making electrical connection with a larger substrate or circuit panel in the form of a printed circuit board ("PCB") or the like. This arrangement facilitates electrical connections needed to achieve desired functionality of the devices. The chip can be electrically connected to the traces and hence to the terminals, so that the package can be mounted to a larger circuit panel by bonding the terminals of the circuit panel to to contact pads on the interposer. For example, some interposers used in microelectronic packaging have terminals in the form of exposed ends of pins or posts extending through the dielectric layer. In other applications, the terminals of an interposer can be exposed pads or portions of traces formed on a redistribution layer.

Despite considerable efforts devoted in the art heretofore to development of interposers and methods for fabricating such components, further improvement is desirable.

BRIEF SUMMARY OF TEE INVENTION

An aspect of the present disclosure relates to an interconnection component including a first support portion having first and second opposed major surfaces defining a thickness therebetween and a plurality of first conductive vias extending through the first support portion substantially perpendicular to the major surfaces and such that each via has a first end adjacent the first surface and a second end adjacent the second surface. The interconnection component further includes a second support portion having first and second opposed major surfaces defining a thickness therebetween and a plurality of second conductive vias extending through the second support portion substantially perpendicular to the major surfaces and such that each via has a first end adjacent the first surface and a second end adjacent the second surface. A redistribution layer is disposed between the second surfaces of the first and second support portions, electrically connecting at least some of the first vias with at least some of the second vias. The first and second support portions can have a coefficient of thermal expansion ("CTE") of less than 12 parts per million per degree, Celsius ("ppm/° C.").

In an embodiment, a smallest pitch of the conductive vias in the first support portion can be smaller than a smallest pitch of the conductive vias in the second support portion. Such an interconnection component can further include first contacts exposed at the first surface of the first support portion. The first contacts can be connected with the first conductive vias. The interconnection component can further include second contacts exposed at the first surface of the second support portion. The second contacts can be connected with the second conductive vias.

The first ends of the first and second conductive vias can be usable to bond the interconnection element to at least one of a microelectronic element, a circuit panel and a package substrate, at least one of the first ends of the first conductive vias or the second conductive vias matching a spatial distribution of element contacts at a face of a microelectronic element and at least one of the first ends of the first conductive vias or the second conductive vias matching a spatial distribution of circuit contacts exposed at a face of at least one of a circuit panel and a package substrate. In an embodiment, the first ends of the first conductive vias can further be usable to bond the interconnection component to a microelectronic element. In this embodiment, the first support portion can have a coefficient of thermal expansion ("CTE") greater than or equal to a CTE of the microelectronic element and less than or equal to a CTE of the second support portion. Additionally or alternatively, the first ends of the second conductive vias can be usable to bond the interconnection element to a circuit panel or a package substrate, and the second support portion can have a CTE that greater than or equal to the CTE of the first support portion. In an embodiment the first support portion can have a CTE ranging from 3 to 6 ppm/° C. and the second support portion can have a CTE ranging from 6 to 12. Alternatively, the CTE of the first support portion and the CTE of the second support portion can be about equal.

In an embodiment of the interconnection component, the first conductive vias can be spaced apart relative to each other at a first pitch, and the second conductive vias can be spaced apart relative to each other at a second pitch that is greater than the first pitch. Further, the first conductive contacts can substantially align with at least some of the second ends of the first vias, and the second conductive contacts can substantially align with at least some of the second ends of the second vias. The redistribution layer can further includes routing circuitry electrically connecting at least some of the first conductive contacts with at least some of the second conductive contacts. In an embodiment, the redistribution layer can further include a dielectric layer in which the routing circuitry is at least partially embedded. Such routing circuitry can include third conductive vias through the dielectric layer, and a smallest pitch of the third conductive vias can be greater than a largest pitch of the first conductive vias and less than a smallest pitch of the second conductive vias. A redistribution layer can include first and second portions, the first portion including the first surface and the first conductive contacts, and the second portion including the second surface and the second conductive contacts. Each of the first and second portions can further include an intermediate surface and intermediate contacts that face each other and are joined together, for example, by conductive masses. The intermediate contacts can also be fused together along with dielectric material of the redistribution layer that is exposed at the intermediate surfaces. The contacts can be fused together, for example using metal to metal joining or oxide to oxide joining.

In an embodiment of the interconnection component, a smallest pitch of the first conductive vias can be smaller than a smallest pitch of the second conductive vias. Alternatively, a smallest pitch of the first conductive vias can be smaller than a smallest pitch of the second conductive vias. The first or second conductive vias can include conductive material deposited in contact with the redistribution layer. The conductive vias can be formed by plating.

In an embodiment, the first support portion can be bonded to the redistribution layer using an adhesive bonding material that can be compliant. Alternatively, the first support portion can be bonded to the redistribution layer using oxide surface-to-surface bonding.

The interconnection component can further include a passive device positioned between the first surfaces of the first and second support portions. The passive device can be electrically connected with one or more of the first conductive vias, the second conductive vias, the first contacts, or the second contacts. The passive device can be disposed between the second surfaces of the support portions. Alternatively, the passive device can be disposed between the first and second opposed surfaces of one of the first or second support portions. As a further alternative, the passive device can be disposed between the second surface of one of the support portions and the first surface of the other of the support portions.

In an embodiment, at least one of the first and second support portions is of a semiconductor material, including, for example, silicon or ceramic. In such an embodiment, any of the first or second support portions that is of a semiconductor material can include a dielectric lining surrounding portions of the support portion adjacent the conductive vias.

A microelectronic assembly can include an interconnection component according to one or more of the embodiments discussed above. Such an assembly can further include a first microelectronic element having element contacts at a face thereof. The first ends of the first vias can match a spatial distribution of the element contacts of the microelectronic element, and the element contacts can be joined with the first ends of the first vias through masses of conductive bonding material. The assembly can be such that the element contacts face the first contacts and are joined thereto with conductive masses. The assembly can further include a second microelectronic element having element contacts thereon. An extension of the second support portion can extend beyond an edge of the first support portion, and the second microelectronic element can be mounted and electrically connected to the extension. Wire bonds can electrically interconnect the second microelectronic element with the extension. Additional wire bonds can connect contacts on the extension with some of the circuit contacts. The assembly can further include a substrate having circuit contacts formed at a surface thereof that can be electrically connected with the circuit contacts. The second support portion can have second contacts exposed at the first surface thereof and electrically connected with the second conductive vias. The second contacts can be joined to the circuit contacts.

A system can include a microelectronic assembly according to one or more of the embodiments discussed above and one or more other electronic components electrically connected to the microelectronic assembly.

Another aspect of the present disclosure relates to a method for making an interconnection component. The method includes forming a redistribution layer on an in-process unit that has a first support portion having a plurality of openings extending from a first surface thereof in a direction substantially perpendicular thereto. The redistribution layer has routing circuitry in registration with the plurality of openings. The method further includes joining a second support portion having first and second opposed major surfaces defining a thickness therebetween with the in-process unit such that the redistribution layer is disposed between the first and second support portions. The first openings are then filled with a conductive material to form first conductive vias extending through the first support portion and connected with the routing circuitry of the redistribution layer. Second conductive vias are then formed in the second support portion extending therethrough substantially perpendicular to the major surfaces and such that each via has a first end and a second end with the second ends adjacent to the second surface. The first conductive vias extend through the first support portion and the second conductive vias extend through the second support portion. The first and second vias are electrically connected through the redistribution layer. The first and second support portions can have a coefficient of thermal expansion ("CTE") of less than 12 parts per million per degree, Celsius ("ppm/° C.").

In an embodiment of the method, the openings can be formed extending partially through the first support portion, and the step of forming first conductive vias through first support portion can further include removing a portion of the first support portion to form a second surface of the first support portion that is substantially parallel to and spaced apart from the first surface and to expose the first openings on the second surface. The openings can be filled with the conductive material after removal of the portion of the first support portion. Alternatively, the openings can be filled with the conductive material before formation of the redistribution layer, and the removal of a portion of the first support portion can expose the conductive material within the openings on the second surface thereof. As a further variation, the openings in the first support portion can be formed after formation of the redistribution layer such that the holes expose portions of the routing circuitry.

The step of forming at least the second conductive vias can include forming holes through the second support portion such that the holes are open to the second surface thereof, filling the holes with a conductive material before bonding with the redistribution layer, and removing material from the support portion to form the first surface of the support portion and to expose the first ends of the vias on the first surface. Alternatively, at least the second vias can be formed by making holes through the second support portion after bonding with the redistribution layer such that the holes expose contacts of the routing circuitry and then filling the holes with a conductive material that electrically connects with corresponding ones of the second contacts. As a further alternative, at least the second vias can bee formed by making holes through a portion of the second support portion such that the holes are open to the second surface thereof, bonding the support portion with the redistribution layer, removing material from the support portion such that the holes are open to the first surface and corresponding contacts are exposed thereat, and filling the holes with conductive material that electrically connects with the conductive contacts and is adjacent to the first surface.

In an embodiment of the method, at least the first support portion and the redistribution layer can be formed as ones of pluralities of redistribution layers formed on first support portions in a single wafer that can then be segmented to form discrete units of redistribution layers formed on ones of the plurality first support portions, including the first support portion.

Another embodiment of the method can further include embedding a passive device within the interconnection component and connecting the passive device with one of the first vias, the second vias, the first contacts, or the second contacts.

A smallest pitch of the conductive vias in the first support portion can be smaller than a smallest pitch of the conductive vias in the second support portion, and the method can further include forming first contacts exposed at the first surface of the first support portion. Such first contacts can be formed so as to connect with the first conductive vias. The method can further comprise forming second contacts exposed at the first surface of the second support portion. Such second contacts can be formed so as to connect with the second conductive vias.

Forming the redistribution layer can include depositing a dielectric layer to at least partially embed the routing circuitry. The routing circuitry can be formed having third conductive vias through the dielectric layer, and a smallest pitch of the third conductive vias can be greater than a largest pitch of the first conductive vias and less than a smallest pitch of the second conductive vias. A smallest pitch of the first conductive vias can be smaller than a smallest pitch of the second conductive vias. A smallest pitch of the first conductive vias can be smaller than a smallest pitch of the second conductive vias.

At least the second support portion can be made from a semiconductor material such as, for example, silicon or ceramic. In such an embodiment forming at least the second conductive vias can include forming holes in the second support portion defining a hole wall, depositing a dielectric lining along the hole wall, and filling the remainder of the hole with a conductive metal.

Another aspect of the present disclosure relates to a method for making an interconnection component. The method can include joining together a first in-process unit having an intermediate surface and intermediate contacts exposed thereon with a second in-process unit having an intermediate surface and intermediate contacts exposed therein such that the intermediate surfaces face each other and the intermediate contacts are electrically interconnected. The first in-process unit includes a first support portion having first and second opposed surfaces defining a thickness therebetween and a plurality of first conductive vias extending through the support portion such that each via has a first end adjacent the first surface and a second end adjacent the second surface. A first redistribution portion is formed on the second surface of the support portion. The first redistribution portion defines the first intermediate surface and includes the first intermediate contacts. The first intermediate contacts are electrically connected with the first conductive vias. The second in-process unit includes a second support portion having first and second opposed surfaces defining a thickness therebetween and a plurality of second conductive vias extending through the support portion such that each via has a first end adjacent the first surface and a second end adjacent the second surface. A second redistribution portion is formed on the second surface of the support portion. The second redistribution portion defines the second intermediate surface and includes the second intermediate contacts. The second intermediate contacts are electrically connected with the second conductive vias. The support portions of the first and second support portions can have a coefficient of thermal expansion ("CTE") of less than 12 parts per million per degree, Celsius ("ppm/° C.").

In an embodiment, the intermediate contacts can be joined together using conductive masses. In such an embodiment, the method can further include forming an underfill between the intermediate surfaces, the underfill being formed to fill spaces between individual ones of the conductive masses. Alternatively, the intermediate contacts can be fused together and a dielectric material exposed at the intermediate surfaces can also be fused together.

Another embodiment of the present disclosure relates to a method for making a microelectronic assembly. The method includes assembling a microelectronic element having element contacts on a face thereof with an interconnection component. The interconnection component has a first support portion having first and second opposed major surfaces defining a thickness therebetween and a first plurality of conductive vias extending through the support portion substantially perpendicular to the major surfaces and such that each via has a first end adjacent the first surface and a second end adjacent the second surface. The interconnection component further includes a second support portion having first and second opposed major surfaces defining a thickness therebetween and a second plurality of conductive vias extending through the support portion substantially perpendicular to the major surfaces and such that each via has a first end adjacent the first surface and a second end adjacent the second surface. A redistribution layer has a first surface bonded to the second surface of the first support portion, a second surface spaced apart from the first surface and bonded to the second surface of the second support portion, a first plurality of conductive contacts along the first surface and connected with respective ones of the vias of the first support portion, and second plurality of conductive contacts along the second surface and connected with respective ones of the vias of the second support portion. At least some of the first plurality of contacts are electrically connected with at least some of the second plurality of contacts. The first and second support portions can have a coefficient of thermal expansion ("CTE") of less than 12 parts per million per degree, Celsius ("ppm/° C."). The first ends of the first vias match a spatial distribution of the element contacts, and the first ends are joined with the element contacts. The method can further include assembling a circuit panel having circuit contacts on a face thereof with the interconnection component, the second contacts matching a spatial distribution of the circuit contacts and being joined therewith.

BRIEF DESCRIPTION OF THE DRAWINGS

Various embodiments of the present invention will be described with reference to the appended drawings. It is appreciated that these drawings depict only some embodiments of the invention and are therefore not to be considered limiting of its scope.

DETAILED DESCRIPTION

Figure 1:
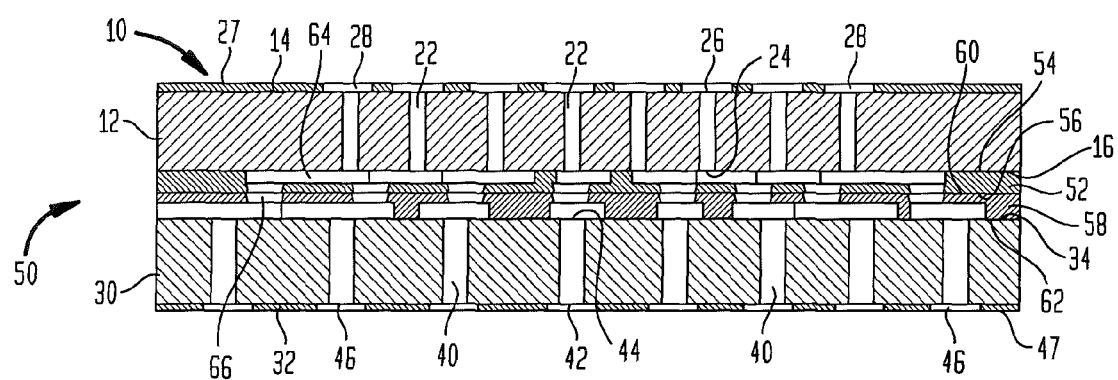
FIG. 1 is an interconnection component according to an embodiment of the present disclosure.

Turning now to the figures, where similar numeric references are used to refer to similar features, FIG. 1 shows a connection component 10 according to one embodiment of the present disclosure. In this embodiment, connection component 10 includes first and second support portions 12, 30 bonded on opposite sides of a redistribution structure 50. Contact pads 28 are exposed on an outside surface of a dielectric layer 27 that overlies surface 14 of first support 12. Contact pads 28 are configured for connection to an external structure or component. Similarly, contact pads 46 are exposed on an outside surface of dielectric layer 47 that overlies outside surface 32 of second support 30. Contact pads 46 are also configured for connection to an external structure or component.

First support portion 12 further includes an inside surface 16 that is generally parallel to outside surface 14 and spaced apart therefrom to define a thickness of first support portion 12. In an embodiment, first support portion 12 has a thickness of at least 5 µm. First support portion 12 can, in some embodiments, have a thickness between 50 µm and up to 300 µm, although a greater thickness is possible. First support portion 12 can be of a dielectric material, such as a polymeric resin material, for example polyimide, glass, or fiber-reinforced epoxy. Alternatively, first support portion 12 can be of a semiconductor material such as silicon. First support portion can also be of a material having a low coefficient of thermal expansion ("CTE"), such as 12 parts per million per degree Celsius ("ppm/° C."). Materials of the types listed above can have such a CTE or can be made in certain variations or mixtures including one or more of the above materials, in addition to others, to achieve a desired CTE.

First support portion 12 includes a plurality of first conductive vias 22 therein extending substantially normal to both inside 16 and outside 14 surfaces through first support portion 12. First conductive vias 22 include inside ends 24 and outside ends 26 that are substantially flush respectively with inside 16 and outside 14 surfaces of first support portion 12. Both outside ends 26 and inside ends 24 can be substantially flush, or coplanar, with surfaces 14, 16, respectively. In an embodiment, first conductive vias 22 are of a conductive material such as metal including copper, gold, nickel, aluminum, etc. Other conductive materials that can be used for first conductive vias 22 include conductive paste, or a sintered matrix including suspended conductive metal. First conductive vias 22 can be used to form electrical connections through first support portion 12 by connection of respective elements to inside 24 and outside 26 ends thereof. First support portion 12 holds the first conductive vias 22 in position and spaces apart the first conductive vias 22 from each other. As shown in the Figures, interconnection component 10 is free from any electrically conductive interconnects running between the first conductive vias 22 or elsewhere in an at least partially lateral direction (parallel to the surfaces 14, 16 of first support portion 12) within the dielectric material between the inside ends 24 and the outside ends 26. Electrical interconnections such as traces or the like can be used to form connections running in a lateral direction outside of the area between inside ends 24 and the outside ends 26. In an example, there are no lateral connections within first support portion 12. In another example, within first support portion 12 the only connections formed are by first conductive vias 22 between the surfaces, 14 and 16.

Second support portion 30 is similar in general structure to first support portion 12 and defines an outside surface 32 and an inside surface 34 that is generally spaced apart and parallel to outside surface 26. The thickness defined between inside 24 and outside 26 surfaces can be in the ranges discussed above with respect to first support portion 12. Further, second support portion 30 can be of any of the materials or combinations of materials, including those having a low CTE, described with respect to first support portion 12. Second support portion 30 can support and retain a plurality of second conductive vias 40 therein. Second conductive vias can have respective inside ends 44 uncovered by second support portion 30 and adjacent to inside surface 34 and outside ends 42 uncovered by second support portion 30 and adjacent to outside surface 32. In an embodiment, inside ends 44 and outside ends 42 are respectively flush with inside surface 34 and outside surface 32. Second conductive vias 40 can extend through second support portion 30 substantially normal to inside 34 and outside 32 surfaces. Further second support portion 30 can include no electronic interconnections extending between second conductive vias 40 in an at least partially lateral direction, as discussed above with respect to first conductive vias 22.

As previously mentioned, first support portion 12 and second support portion 30 are arranged such that their respective inside surfaces 14 and 34 face each other. First support portion 12 and second support portion 30 are then bonded to opposing surfaces of a redistribution structure 50 such that component 10 is secured as a single unit. Redistribution structure 50 also electrically interconnects respective pairs of first conductive vias 22 and second conductive vias 40 such that an electronic interconnection can be made between a structure connected with a selected outside end 26 of a first conductive via 22 and an opposite outside end 42 of a second conductive via 40. The electrical interconnection is achieved through redistribution structure through redistribution circuitry in the form of, for example, traces 64 and vias 66 embedded in one or more dielectric layers that are included in redistribution structure 50. In the example shown in FIG. 1, redistribution structure 50 includes a first dielectric layer 52 and a second dielectric layer 58, but in other embodiments more or fewer dielectric layers can be used. As shown first dielectric layer 52 has an outside surface 54 that is bonded to inside surface 16 of first support portion 12. Similarly, second dielectric layer 58 has an outside surface 60 bonded to inside surface 34 of second support portion 30. First dielectric layer 52 includes a plurality of traces 64 embedded therein that are connected with respective ones of the first conductive vias 22 at the inside ends 24 thereof. Traces 64 are then joined with respective vias 66 remote from the inside ends 24 and spaced apart therefrom in one or more lateral directions. Similarly second dielectric layer 58 includes a plurality of traces 64 embedded therein that are connected with respective ones of the second conductive vias 40 at the inside ends 44 thereof. Traces are then joined with respective vias 66 remote from the inside ends 44 and spaced apart therefrom in one or more lateral directions.

At least some of the vias 66 in both first dielectric layer 52 and second dielectric layer 58 are exposed at respective inside surfaces 56, 62, making them available for electrical connection. In the embodiment shown, at least some of the vias 66 exposed at inside surface 56 of first dielectric layer align with respective ones of at least some of the vias 66 exposed at inside surface 62 of second dielectric layer 58, making corresponding pairs of aligning vias 66. As shown in FIG. 1, these pairs of corresponding vias are aligned and joined with each other to achieve the desired electrical interconnection, through redistribution structure 50, between the corresponding pairs of first conductive vias 22 and second conductive vias 40. In the embodiment of FIG. 1, the corresponding vias 66 are joined to each other through a form of metal-to-metal joining such as by oxide surface-to-surface joining or other similar means such as joining by way of a coating of a bond metal, e.g., tin, indium or solder on one or both of the vias 66. As further shown in FIG. 1, the respective inside surfaces 56 and 62 of first and second dielectric layers 52 and 58, contact each other and can be held together through the joining of the pairs of vias 66 of using additional means such as by adhesive or the like.

Figure 2:
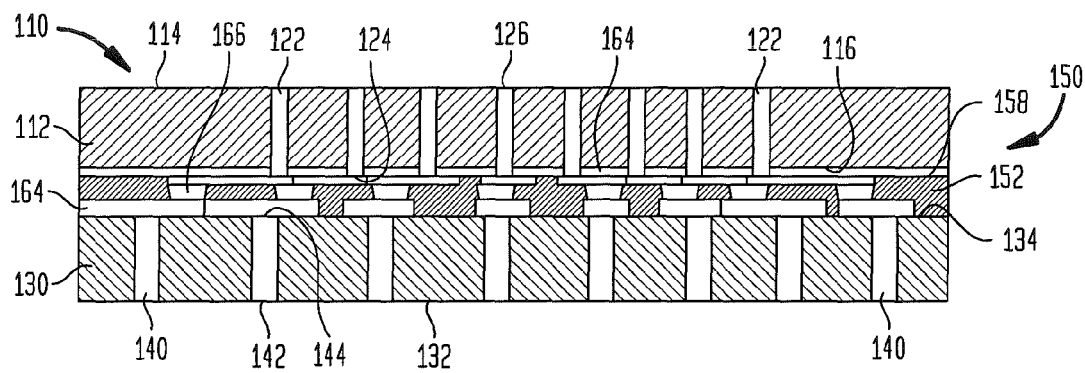
FIG. 2 is an interconnection component according to another embodiment of the present disclosure.

As shown in FIG. 1, wettable contacts in the form of contact pads 28 and 46 can be exposed at outside surfaces 14 and 32, respectively. Additional, wettable metal layers or structures can be added to interconnection component 10 that can be wettable contacts for connection to other microelectronic components. Such wettable metal layers or structures can be made from nickel or Ni—Au, or organic solderable preservative ("OSP"). Such wettable contacts can overlie and be electrically connected with respective outside ends 26 and 42 of first conductive vias 22 and second conductive vias 40. The contact pads 28 and 46 can be spatially positioned respectively over outside surfaces 14 and 32 in an array that corresponds to the conductive vias 22 or 40 to which they are connected. Contact pads 28 and 46 can vary in size to accommodate the size, or pitch, of array that they are positioned in, without contacting each other, or to achieve the desired electrical connection with one or more external structures. Contact pads 28 and 46 can be of the same or of a different conductive material than vias 22 and 40. Contact pads 28 or 46 can be positioned within their respective dielectric layers 27 or 47 such that they are displaced in one or more lateral directions from the vias 22 or 40 to which they are connected such to form a redistribution layer. Additional redistribution layers can be included between those including contact pads 28 or 46 to achieve the connection with the respective vias 22 or 40 such as by traces or redistribution vias. In another embodiment, such as that which is shown in FIG. 2, outside ends 26 and 34 of first conductive vias 22 and second conductive vias 40, respectively can be the wettable contacts for connection component 10.

Figure 5A:
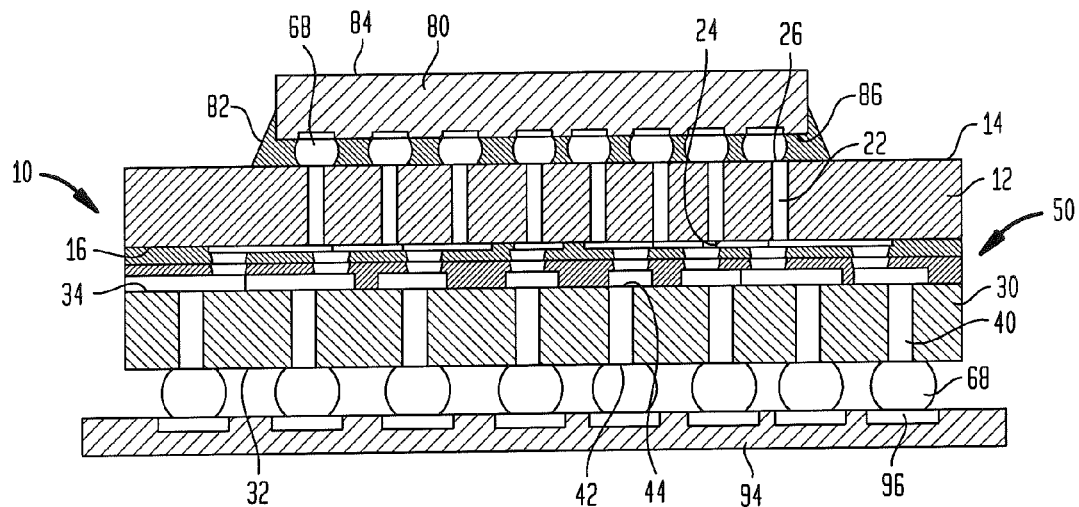
FIG. 5A is a microelectronic assembly including an interconnection component according to FIG. 1.

The wettable contacts, whether pads 28 and 46, outside ends 26 and 34, or other suitable structures, can allow connection component 10 to connect to or between microelectronic components that respectively overlie outside surfaces 14 and 32 of component 10. As shown in FIG. 5A, connection component 10 can be used to connect a microelectronic element 80 overlying outside surface 14 to a circuit panel 94 that outside surface 32 overlies. In an embodiment, connection component 10 can be used to form such a connection between two microelectronic components that have contacts arranged thereon in different respective pitches. As shown in FIG. 5, microelectronic element 80 has a front surface 82 with contacts 86 exposed thereon. A back surface 82 is spaced apart from and parallel to front surface 82. Microelectronic element 80 is mounted to outside surface 14 as a flip-chip, having front surface 82 facing outside surface 14 and having contacts 86 bonded to outside ends 26 of vias 22 using solder balls 68. Connection component 10 (and, thus, microelectronic element 80) is mounted to circuit panel 94 by joining outside ends 42 of vias 40 to circuit contacts 96 using solder balls 68. It is noted that the designation of support structures as "first" and "second" is made only for clarity in referring to the various support structures and does not have any bearing as to which support structure is to be connected to any of the microelectronic components discussed herein, or which support structure includes wettable contacts in an array of a greater or lesser pitch, etc.

As shown, contacts 86 of microelectronic element 80 are generally spaced apart in an array having a pitch that is smaller than that of the circuit contacts 96 on circuit panel 94. Accordingly, first conductive vias 22 (and thus outside ends 26) are arranged in an array configuration, including a pitch thereof, that substantially matches the array configuration and pitch of the microelectronic element 80 contacts 86. Similarly, second conductive vias 40 are arranged in an array configuration, including a pitch thereof, that substantially matches the array configuration and pitch of circuit contacts 96. In an embodiment having contact pads, such as contact pads 28 and 46, the contact pads can also match the array configuration an pitch of the respective component contacts to which they are joined. Arrays of contacts can be in any desired configuration, such as in a grid having a number of rows and columns. The pitch of an array can be measured based on a uniform spacing of contacts in one or more directions. Alternatively, the pitch can be designated as an average, maximum, or minimum distance between contacts in an array. In other embodiments, the pitch of the wettable contacts on outside surface 14 and outside surface 32 can be substantially the same, or the pitch of the wettable contacts on outside surface 14 can be greater than the pitch of the wettable contacts on outside surface 32. In an embodiment, the wettable contacts, such as outside ends 26 can be in an array having a first pitch, and wettable contacts, such as outside ends 42 can have a second pitch that is between 1 and 5 times the size of first pitch. In another embodiment, the second pitch can be about 2 times the size of first pitch.

In an embodiment, vias 66, such as the corresponding pairs of vias 66 that connect between adjacent dielectric layers in dielectric structure 50, can be arranged in a third pitch that is between the pitch of first conductive vias 22 and second conductive vias 40. Such a configuration can be useful in efficiently arranging the routing circuitry through redistribution structure 50. In other embodiments the traces 64 and vias 66 can be in an array having a pitch that is substantially equal the pitch of either first conductive vias 22 or second conductive vias 40, or can be in an array that is greater than that of both first conductive vias 22 and second conductive vias 40. Further arrangements are possible, including one in which vias 66 are in a non-uniform arrangement.

The CTEs of the support portions 12 and 30 can also be different. In one embodiment, such as that shown in FIG. 5A, microelectronic element 80 can have a CTE that is less than that of circuit panel 94. In embodiments where a microelectronic element having a low CTE is assembled with a circuit panel having a higher CTE, repeated heat cycling can lead to fracture of the connections between the components, such as fracture of solder bonds or the like. In an embodiment, first support portion 12 and second support portion 30 can both have a CTE that is between the CTE of microelectronic element 80 and the CTE of circuit panel 96. This arrangement can increase the reliability of the connections between components, including solder bonds 68. In a further embodiment where microelectronic element 80 overlies first support portion 12, the CTE of first support portion 12 can be lower than the CTE of second support portion 30, which overlies circuit panel 94. For example, in such an embodiment, microelectronic element can have a CTE of about 3 ppm/° C. and circuit panel can have a CTE of about 12 ppm/° C. Accordingly, the CTE of first support portion 12 can be greater than 3 ppm/° C. and the CTE of second support portion 30 can be less than 12 ppm/° C. and the CTE of first support portion 12 can be less than that of second support portion 30. In a further example of such a range, first support portion 12 can have a CTE of between 3 and 6 ppm/° C. and second support portion 12 can have a CTE of between 6 and 12 ppm/° C. Alternatively, first support portion 12 can have a CTE of between 3 and 7 ppm/° C. and second support portion 12 can have a CTE of between 7 and 12 ppm/° C.

The dielectric material used in redistribution structure 50, such as dielectric layers 52 and 58 can also have a low CTE. The CTE of the redistribution dielectric can further be between that of the first support portion 12 and the second support portion 30. For example, in the embodiment described above, first support portion 12 can have a CTE of about 4 ppm/° C., second support portion 30 can have a CTE of about 10 ppm/° C., and first and second dielectric layers 52 and 58 can both have a CTE of about 7 ppm/° C.

Figure 5B:
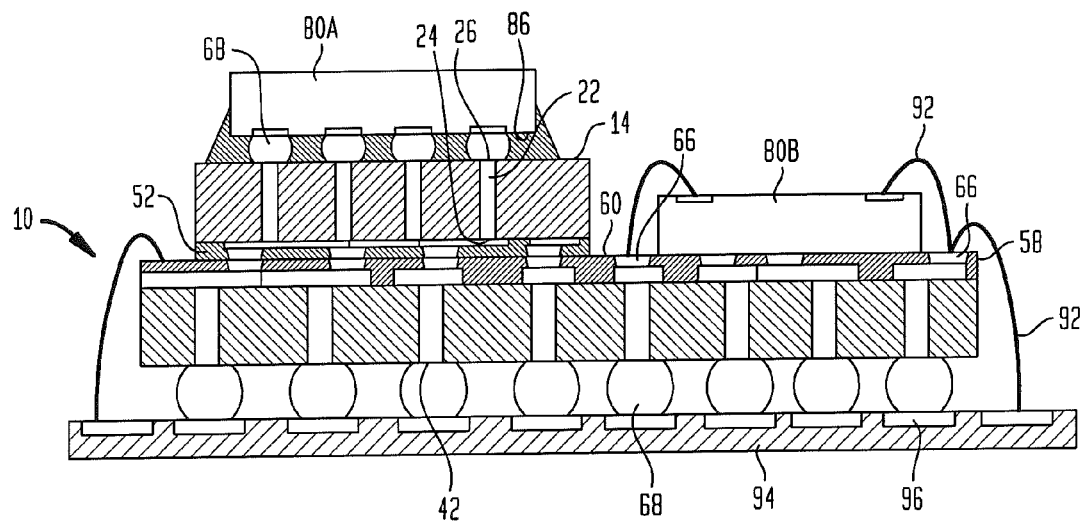
FIG. 5B is another microelectronic assembly including an interconnection component according a variation of the component of FIG. 1.

In the embodiment of FIG. 5B, an interconnection component 410 includes a first support portion 412 that covers only a portion of the area of inside surface 434 of second support portion 430. This embodiment can be similar in other respects to the embodiments of FIG. 1 and FIG. 5A. Redistribution structure 450 is arranged between first support portion 412 and second support portion 430 and includes a first dielectric layer 452 bonded to and corresponding generally in size to first support portion 412 and a second dielectric layer bonded to second support portion 430. In the embodiment shown, a portion of inside surface 462 of second dielectric layer 458 is exposed outside of the area covered by first dielectric layer 452. Accordingly vias 466 associated with second dielectric layer 458 can be available for connection with one or more external components such as microelectronic element 480B, which is shown bonded, face-up to surface 460. Contacts 486 of microelectronic element 480B are then wire bonded to at least some of the exposed vias 466 on second dielectric layer 458. Respective ones of second conductive vias 440 are connected with the vias 466 that are connected with microelectronic element 480B for connection with circuit panel 494 via solder balls 468. Another microelectronic element 480A is mounted on outside surface 414 of first support portion 412, as described above with respect to microelectronic element 80 in FIG. 5A. Contacts 486 of microelectronic element 480A are joined with ends 426 of vias 422, which are connected through redistribution structure 450 with respective ones of vias 440 for connection with respective contacts 496 of circuit panel 494. Additionally, some of the exposed vias 466 of second dielectric layer 258 can be configured for connection to an microelectronic component such as circuit panel 494 by wire bonds 492 or the like.

The embodiment of connection component 410 shown in FIG. 5B can be used to connect microelectronic elements 480A and 440B having different CTEs, for example, to a circuit panel 494 having a CTE higher than both microelectronic elements 480A and 440B. In an embodiment microelectronic element 480A can have a first CTE and microelectronic element 480B can have a second CTE higher than the first CTE. Second support portion 430 can have a CTE between the second CTE and the CTE of circuit panel 494. Additionally, first support portion 412 can have a CTE between the CTE of second support portion 430 and the first CTE.

A connection component 110 according to another embodiment is shown in FIG. 2. The connection component 110 is similar to the connection component 10 described above with respect to FIG. 1 and includes a first support portion 112 and a second support portion 130 joined together through a redistribution structure 150. Both first support portion 112 and second support portion 130 include conductive vias 122 and 140, respectively, that extend from respective inside surfaces 116 and 134 to respective outside surfaces 114 and 132 thereof. Wettable contacts are exposed on the outside surfaces 114 and 132, which in the embodiment shown are formed by outside ends 126 exposed on outside surface 114 and outside ends 142 exposed on outside surface 132. The wettable contacts can be used to connect external microelectronic components together using connection component 110 in a similar arrangement to that shown in FIG. 5A. Accordingly first conductive vias 122 and second conductive vias 140 can be arranged in arrays having different pitches that correspond to respective microelectronic components connected thereto and first support portion 112 and second support portion 130 can have similarly-selected CTEs. The connection component 110 can also be configured in another embodiment similar to the embodiment shown in FIG. 5B in a similar assembly with external microelectronic components.

In the connection component 110 of FIG. 2, redistribution structure 50 includes a single dielectric layer 152 that has traces 164 and vias 166 included in routing circuitry embedded therein. Some of the traces 164 are connected with and extend laterally from inside ends 124 of first conductive vias 122 and others are connected with and extend laterally from inside ends 144 of second conductive vias 140. Some of the vias 166 within dielectric layer 150 interconnect respective pairs of first conductive vias 122 and second conductive vias 140 by connection between their associated traces 164. Vias 166 can have a pitch that is equal to a pitch of first conductive vias 122 or second conductive vias 140. In such an embodiment, the vias 166 can connect directly to either of the first conductive vias 122 or second conductive vias 140 directly, without the use of a trace. In such an embodiment first support portion 112 or second support portion 130 can be bonded to dielectric layer 152 using an adhesive layer 148 or the like that can be of a compliant material.

Figure 3:
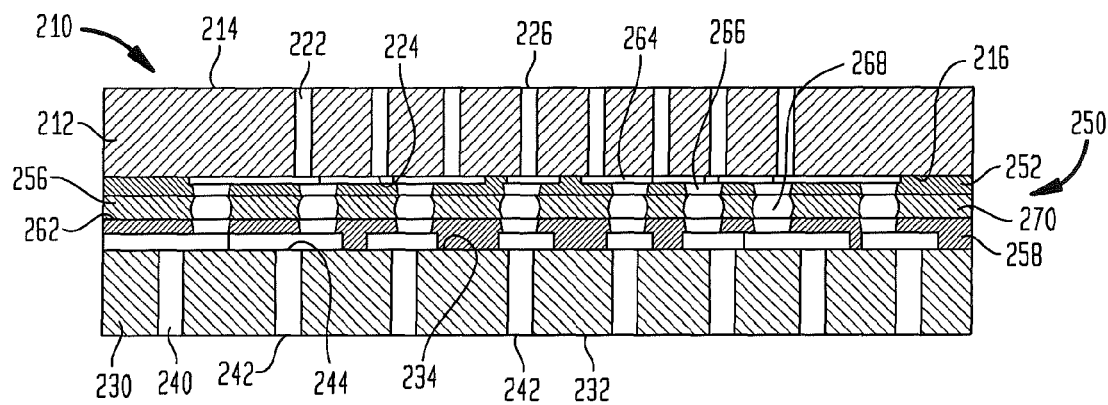
FIG. 3 is an interconnection component according to another embodiment of the present disclosure.

FIG. 3 shows another embodiment of a connection component 210 that is similar to the connection component 10 shown in FIG. 1. In this embodiment, first dielectric layer 252 and second dielectric layer 258 within redistribution structure 250 are spaced apart. Pairs of vias 266 that align between first dielectric layer 252 and second dielectric layer 258 are joined together using masses of conductive material such as solder balls 268. The resulting space between inside surface 256 of first dielectric layer 252 and the inside surface 262 of second dielectric layer 258 can be filled by an underfill 270 that fills the spaces between the solder balls 268.

Figure 4A:
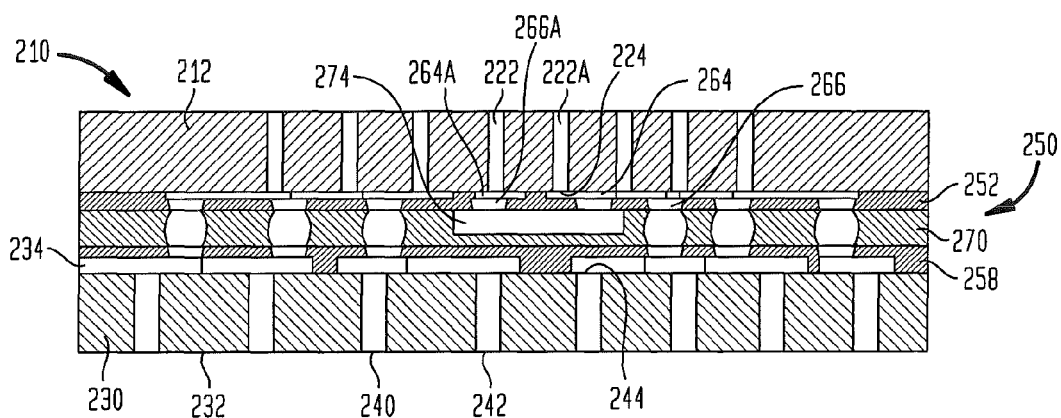
FIG. 4A is an interconnection component that is a variation of the interconnection component of FIG. 3.
Figure 4B:
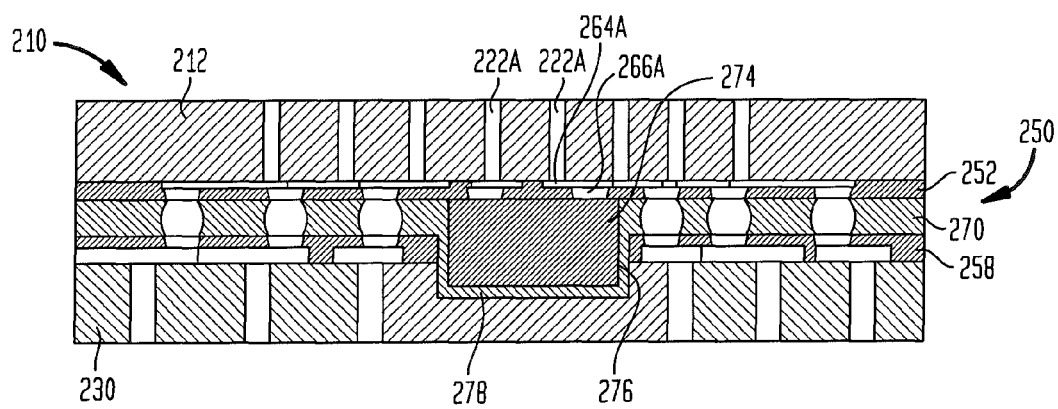
FIG. 4B is an interconnection component that is another variation of the interconnection component of FIG. 3.
Figure 4C:
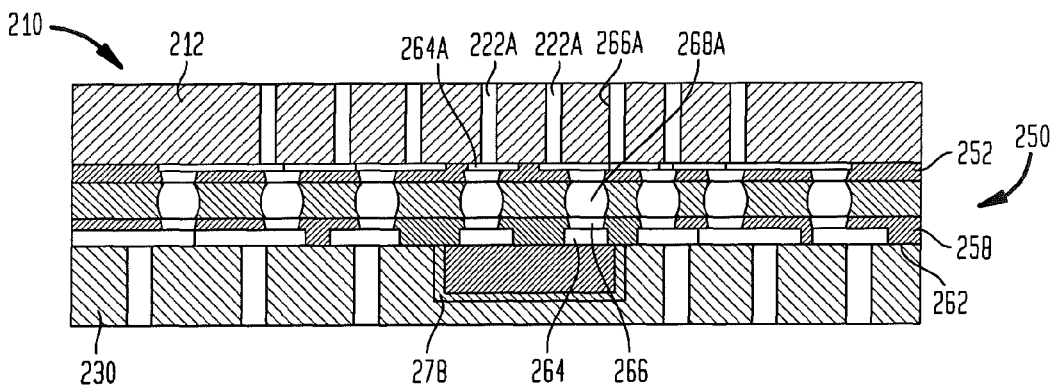
FIG. 4C is an interconnection component that is another variation of the interconnection component of FIG. 3.

As shown in FIGS. 4A-4C, at least one passive device, such as a resistor, capacitor, transistor, diode, or the like, can be embedded within a connection component according to various embodiments of the present disclosure. In FIGS. 4A-4C an exemplary passive 274 is embedded in a connection component 210 that is similar to the embodiment shown in FIG. 3 and discussed above. Other embodiments connection components discussed herein and shown in the figures can also have passives embedded therein in similar structures. In FIG. 4A, passive 274 is mounted over inside surface 256 of first dielectric layer 250 and is electrically connected with vias 266A that are connected through traces 264 with respective ones of first conductive vias 222A. Accordingly, a microelectronic component that is connected with first conductive vias 222A will be connected with passive 274. Passive 274 or the space between inside surfaces 256 and 262 can be sized such that passive 274 fits completely within this space. In such an embodiment, underfill 270 can surround passive 274 and fill spaces between passive 274 and solder balls 260. A passive, such as passive 274 can be mounted over inside surface 262 of second dielectric layer 260 and embedded within redistribution structure 250 in a similar manner. An embodiment of a connection component, such as those shown in FIGS. 1 and 2 can include a passive embedded within their corresponding redistribution structures in a similar manner, for example, by including an additional dielectric layer in place of underfill 270 and by adding taller or additional vias to connect those exposed for connection on the inside surfaces of their first and second dielectric layers.

FIG. 4B shows an alternative incorporation of a passive 274. In this embodiment, passive 274 is connected with vias 266 exposed at inside surface 256 of first dielectric layer 252 and has a height that is greater than that of the redistribution structure. To accommodate the height of passive 274, an opening 276 is incorporated in second dielectric layer 258 and a matching cavity 272 is incorporated in second support portion 230 to receive a portion of passive 274. Connection component 210 can be similarly structured to include a passive similar to passive 274 that is mounted over second dielectric layer 258 and extends into a cavity in first support portion 212. Furthermore, the embodiments of FIGS. 1 and 2 can also be structured in a similar manner to receive a similar passive device.

FIG. 4C shows a connection component 210 having a passive 274 mounted on outside surface 260 of second dielectric layer 258 and received in an appropriately-sized cavity 278 formed in second support portion 230. Passive 274 is connected with selected ones of vias 266A in second dielectric layer 258, which are, in turn, connected with corresponding vias 266 in first dielectric layer 252 that are connected with respective ones of first conductive vias 222A having outside ends 226 on outside surface 213. Accordingly, a microelectronic component that is connected with first conductive vias 222A will be connected with passive 274. Alternatively, vias 266A can be connected with respective ones of second conductive vias 240 through corresponding ones of traces 266 for connection with an external component through outside ends 244. A passive can be mounted on outside surface 254 of first dielectric layer 252 in a similar manner. The embodiments of FIGS. 1 and 2 can also be structured to include a similar passive device in a similar manner.

Figure 6:
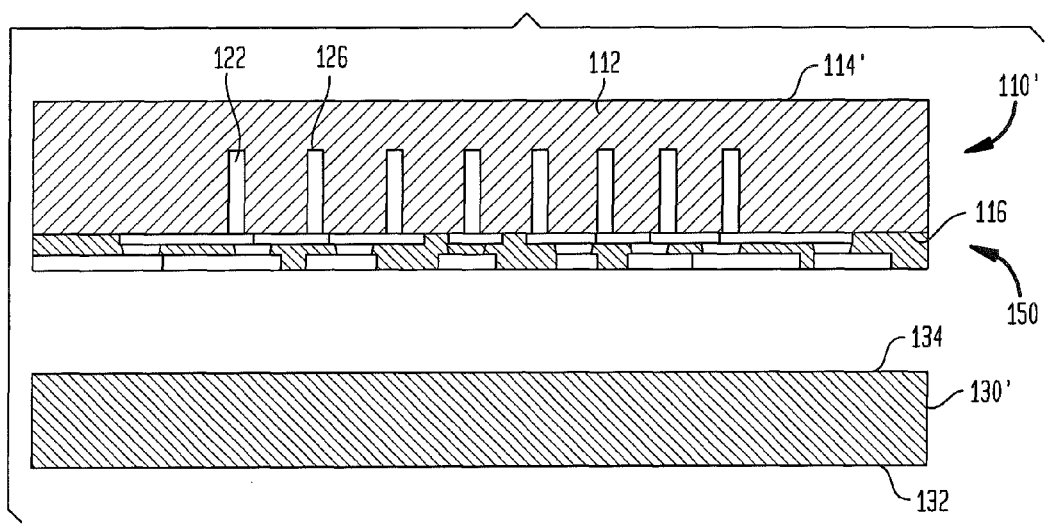
FIGS. 6-8 show an interconnection component according to an embodiment of the present disclosure during various steps of a fabrication method thereof.
Figure 7:
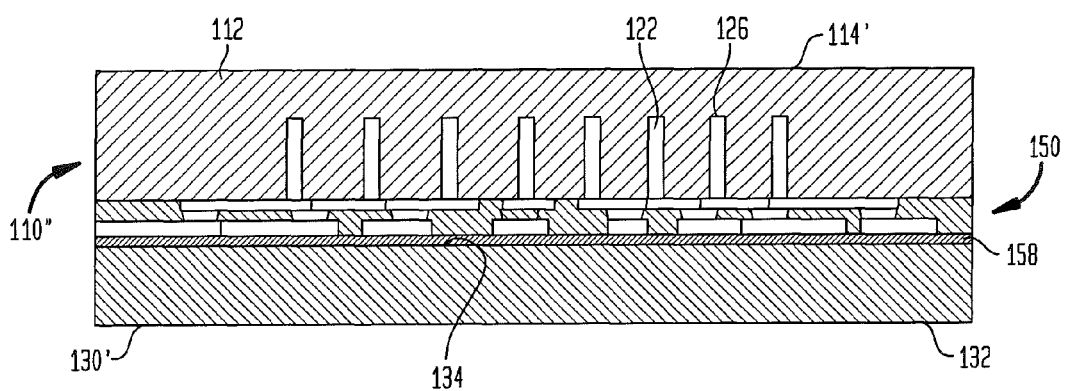
Figure 8:
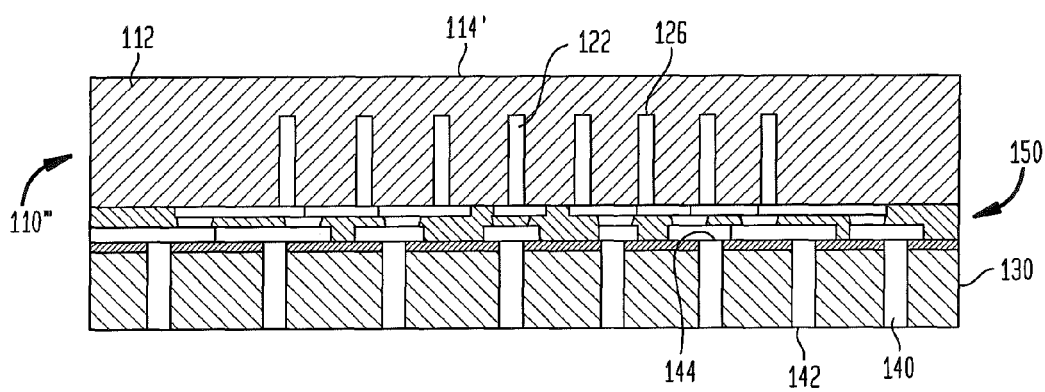

FIGS. 6-8 show a method for making a connection component 110 such as that which is shown in a completed form in FIG. 2. As shown in FIG. 6, an in process unit 110' is formed including first support portion 112' having first conductive vias 122 therein, as discussed above with respect to FIGS. 1 and 2. The first support portion 112' in FIG. 6 is formed such that outside ends 126 of vias 122 are covered by first support portion 112' and such that outside surface 114' is spaced above outside ends 126. Redistribution structure 150 is formed over inside surface 116 of first support portion 112' and includes routing circuitry connected with inside ends 124 of first conductive vias 122, as described above. In-process unit 110' can be made by forming blind holes in first support portion 112' and filling them with a conductive material, such as metal and by then forming redistribution structure 150 over inside surface 116. In another embodiment, the blind holes used to form vias 122 can be left unfilled until after formation redistribution structure 150 Alternatively, redistribution structure 150 can be formed on, for example, a carrier then first conductive vias 122 can be formed by plating, for example, on the appropriate portions of the routing circuitry within redistribution structure 150. First support portion 112' can then be formed over the first conductive vias 122 by molding or the like. These and other methods for forming a structure such as in-process unit 112' are shown and described in co-pending, commonly-assigned U.S. patent application Ser. No. 13/091,800, the entire disclosure of which is incorporated by reference herein.

In another embodiment, the blind holes used to form vias 122 can be left unfilled until after formation redistribution structure 150. The blind holes can then be opened by removing an outside portion of first support portion 112', such as by grinding, polishing, etching or the like. Once the holes are opened on second surface 114, they can be filled with conductive material to form vias 122. In a further alternative, the holes used to form vias 122 can be formed in first support portion 112' after formation of redistribution structure 150. This can be done, for example, by drilling holes into first support portion 112' from over second surface 114 to expose contacts 124 thereat. The holes can then be filled to form vias 122 connected with contacts 124.

As further shown in FIG. 6, a blank 130' is provided and aligned with in-process unit 112'. Blank 130' will be used to form second support portion 120 and, accordingly can be made of any of the materials discussed herein and can be selected to have certain characteristics, including CTE, as further discussed elsewhere herein. As shown in FIG. 7, blank 130' is added to in-process unit 112'' such as by bonding. This can be done using an adhesive layer 148 or the like. Alternatively, a blank 130' can be molded in-place on an in-process unit 112' to achieve the structure of FIG. 7, without adhesive layer 148.

As shown in FIG. 8, second conductive vias 140 are then formed in blank 130' to form second support portion 130 similar to that which is shown in FIG. 2 and further described with respect to the embodiment of FIG. 1. Second conductive vias 140 can be formed in blank 130' by drilling blind holes to expose corresponding ones of vias 166 and then by depositing a conductive metal into those holes to connect with the selected vias 166 and to fill the holes and form outside ends 142 of second conductive vias 140 exposed at outside surface 132 of second support portion 130 to result in the in-process unit 110''' shown in FIG. 8. The in-process unit 110''' can then be further processed to result in the connection component 110 of FIG. 2 by removing a portion of first support portion 112' to lower outside surface 114' and expose outside ends 126 of vias 122 on outside surface 114. This can be completed by mechanical polishing, grinding, lapping, or the like. Etching, such as chemical etching or laser etching can also be used. Grinding and polishing can also be used to help make outside ends 126 substantially flush with outside surface 114. Similarly, second support portion 130 can be ground or polished at outside surface 132 thereof, which can include grinding or polishing of outside ends 142, to make outside ends 142 and outside surface 132 substantially flush. By forming in-process unit 110', shown in FIG. 6, with a thicker first support portion 112', and grinding or polishing later to exposed outside ends 126, the in-process unit 110' can be easier to handle and less prone to breaking during further steps of fabrication of connection component 110.

Figure 9:
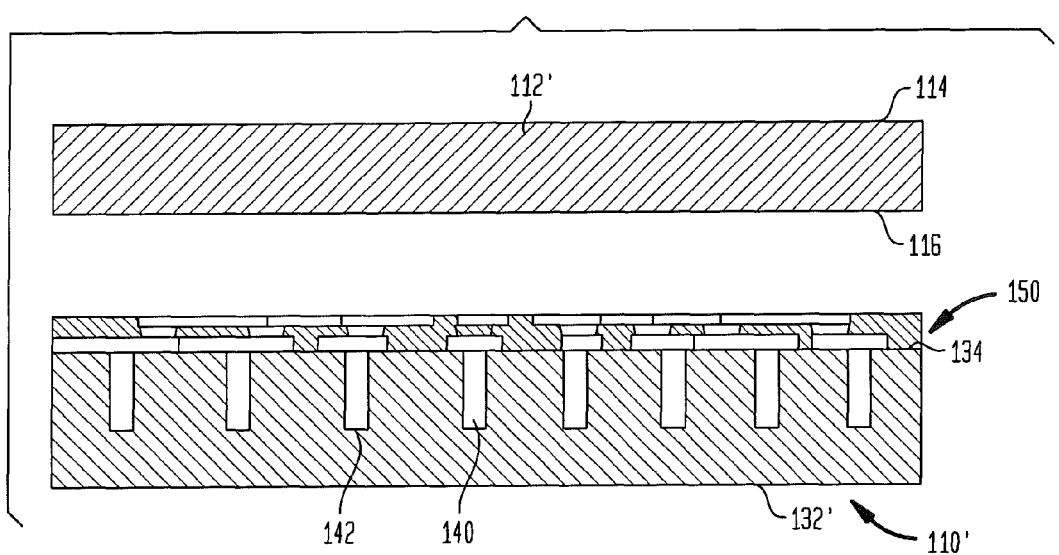
FIGS. 9-11 show an interconnection component according to an embodiment of the present disclosure during various steps of the fabrication thereof.
Figure 10:
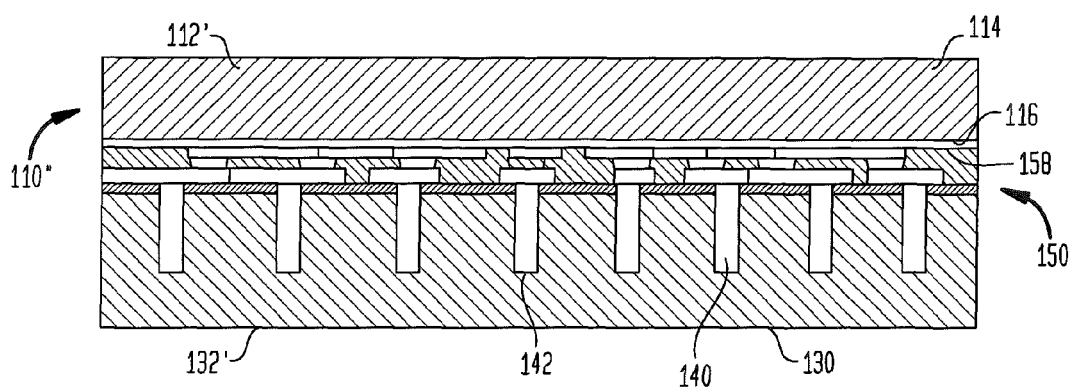
Figure 11:
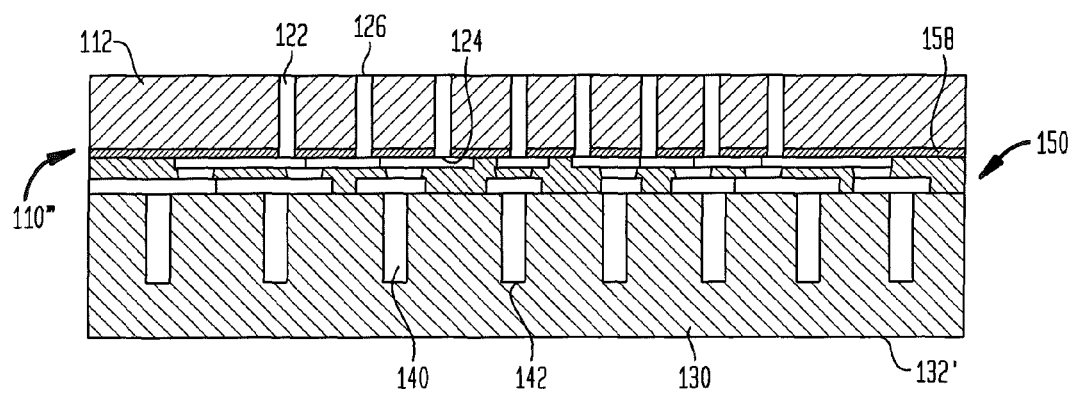

A further method for making a connection component similar to connection component 110 shown in FIG. 2 is shown in FIGS. 9-11. This method is similar to that which was described above with respect to FIGS. 6-8, except that in-process unit 110''' is formed including a redistribution structure 150 on second support portion 130' with second conductive vias 140 therein. In the embodiment of FIGS. 6-8 the finer-pitched first conductive vias 122 are included in the in-process unit, whereas in the embodiment of FIGS. 9-11 the more coarse pitched second conductive vias 140 are formed in in-process unit 110'. In this embodiment, the first conductive vias 122 are formed in blank 112' after assembly to in-process unit 110", as shown in FIG. 10. This results in the in-process unit 110''' shown in FIG. 11, which can be further processed, as described above with respect to FIG. 8 to result in the connection component 110 of FIG. 2.

Figure 12:
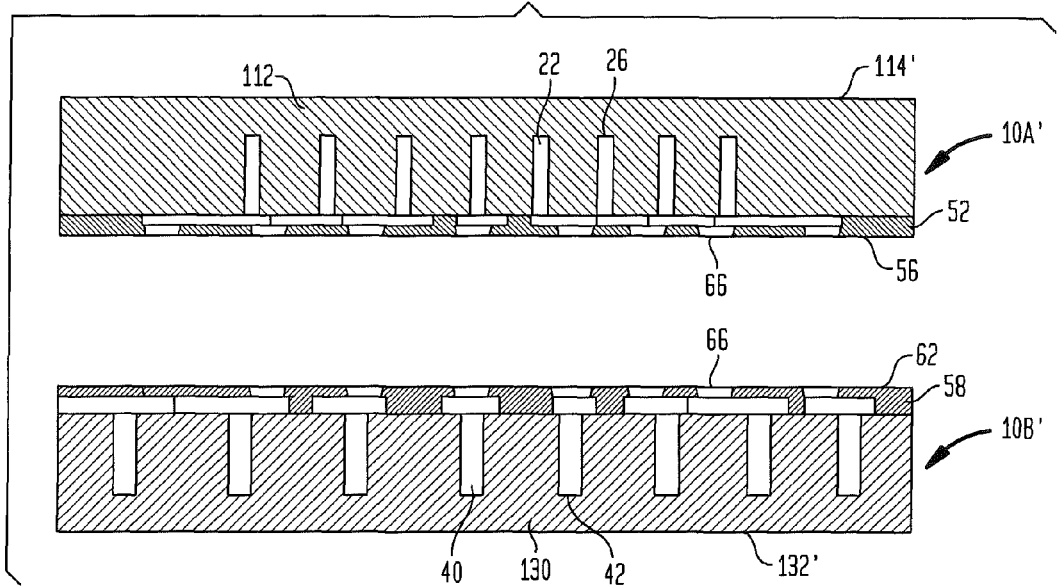
FIGS. 12 and 13 show an interconnection component according to an embodiment of the present disclosure during various alternative steps of an alternative fabrication method thereof.
Figure 13:
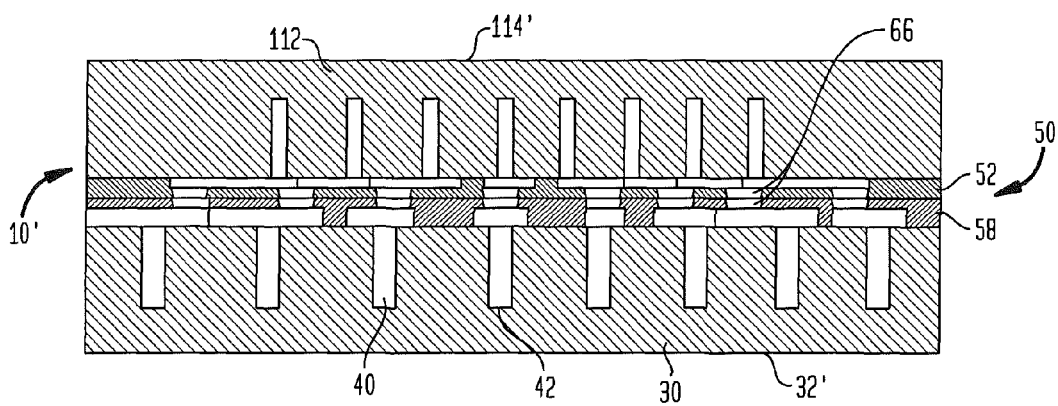

FIGS. 12 and 13 show an interconnection component such as the interconnection component of FIG. 1 during various stages a method for fabrication thereof. As shown in FIG. 12, two in-process units 10A' and 10B' are formed and aligned with each other. First in-process unit 10A' includes first support portion 12 having first conductive vias 122 formed therein and first dielectric layer 52 formed over inside surface 16 of first support portion 12. Second in-process unit 10B' includes second support portion 30 having second conductive vias 140 formed therein and second dielectric layer 58 formed over inside surface 34 of second support portion 30. Both first and second in-process units 10A' and 10B' can be formed according to the methods discussed above with respect to FIG. 6 and the individual features thereof can be formed according to the discussion of FIG. 1. As shown in FIG. 13, the inside surfaces 56 and 62 of first dielectric layer 52 and second dielectric layer 58, respectively are positioned in contact with each other (and optionally bonded together using adhesive or the like) and the corresponding pairs of vias 66, one exposed on inside surface 56 and the other exposed on inside surface 62, are bonded together using metal-to-metal joining, as discussed above. This results in the in-process unit 10' of FIG. 13, which is then processed in a manner similar to that which was previously discussed with respect to FIG. 8, to expose outside ends 26 and 42 on outside surfaces 14 and 32. Additional steps can be performed in any of the methods discussed herein, including the formation of conductive pads, such as pads 28 and 46 on outside surfaces 14 and 32, the formation of additional redistribution layers over outside surfaces 14 or 32 with wettable contacts exposed thereon, or other further structures. The resulting connection components can then be assembled with various other components, such as shown in and describe with respect to FIGS. 5A and 5B.

Figure 14:
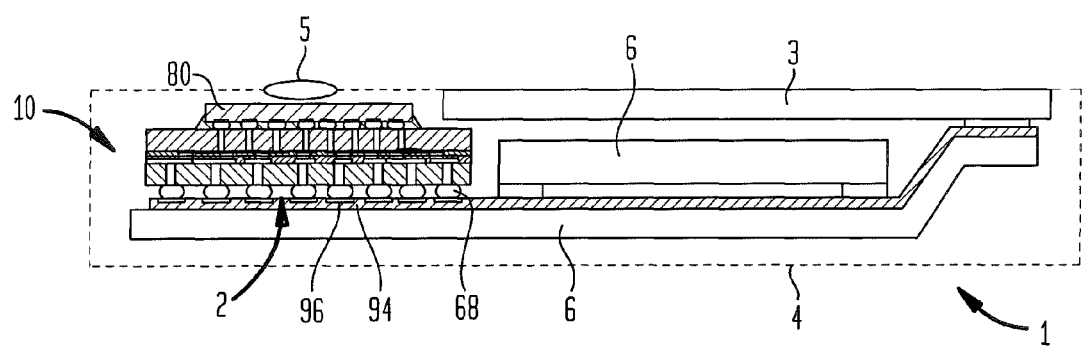
FIG. 14 is a system that can include a microelectronic assembly according to FIG. 5A.

Various embodiments of the connection components described herein can be used in connection with various diverse electronic systems. The interconnection components described above can be utilized in construction of diverse electronic systems, as shown in FIG. 14. For example, a system 1 in accordance with a further embodiment of the invention can include a microelectronic assembly 2, being a unit formed by assembly of a microelectronic element 80 with an interconnection component 10, similar to the microelectronic assembly of a microelectronic element 80 and interconnection component 10 as shown in FIG. 5A. The embodiment shown, as well as other variations of the interconnection component or assemblies thereof, as described above can be used in conjunction with other electronic components 6 and 3. In the example depicted, component 6 can be a semiconductor chip or package or other assembly including a semiconductor chip, whereas component 3 is a display screen, but any other components can be used. Of course, although only two additional components are depicted in FIG. 14 for clarity of illustration, the system may include any number of such components. In a further variant, any number of microelectronic assemblies including a microelectronic element and an interconnection component can be used. The microelectronic assembly and components 6 and 3 are mounted in a common housing 4, schematically depicted in broken lines, and are electrically interconnected with one another as necessary to form the desired circuit. In the exemplary system shown, the system includes a circuit panel 94 such as a flexible printed circuit board, and the circuit panel includes numerous conductors 96 interconnecting the components with one another. However, this is merely exemplary; any suitable structure for making electrical connections can be used, including a number of traces that can be connected to or integral with contact pads or the like. Further, circuit panel 94 can connect to interconnection component 10 using solder balls 68 or the like. The housing 4 is depicted as a portable housing of the type usable, for example, in a cellular telephone or personal digital assistant, and screen 3 is exposed at the surface of the housing. Where system 1 includes a light-sensitive element such as an imaging chip, a lens 5 or other optical device also may be provided for routing light to the structure. Again, the simplified system 1 shown in FIG. 14 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An interconnection component, comprising:
   a first support portion having first and second opposed major surfaces defining a thickness therebetween and a plurality of first conductive vias extending through the first support portion substantially perpendicular to the major surfaces and such that each via has a first end adjacent the first surface and a second end adjacent the second surface;
   a second support portion having first and second opposed major surfaces defining a thickness therebetween and a plurality of second conductive vias extending through the second support portion substantially perpendicular to the major surfaces and such that each via has a first end adjacent the first surface and a second end adjacent the second surface; and
   a redistribution layer disposed between the second surfaces of the first and second support portions, electrically connecting at least some of the first vias with at least some of the second vias,
   wherein at least one of the first and second support portions is of a semiconductor material, and
   wherein any of the first or second support portions that is of a semiconductor material includes a dielectric lining surrounding portions of the support portion adjacent the conductive vias.

2. The interconnection component of claim 1, wherein the redistribution layer is formed over the first surface of at least one of the first support portion and the second support portion, the redistribution layer including contacts exposed on an outside surface thereof, the contacts being connected with the first conductive vias or the second conductive vias.

3. The interconnection component of claim 2, further comprising second contacts exposed at the first surface of the second support portion, the second contacts connected with the second conductive vias.

4. The interconnection component of claim 1, wherein a smallest pitch of the conductive vias in the first support portion is smaller than a smallest pitch of the conductive vias in the second support portion, the interconnection component further comprising first contacts exposed at the first surface of the first support portion, the first contacts connected with the first conductive vias.

5. The interconnection component of claim 1, wherein the first ends of the first and second conductive vias are usable to bond the interconnection element to at least one of a microelectronic element, a circuit panel and a package substrate, at least one of the first ends of the first conductive vias or the second conductive vias matching a spatial distribution of element contacts at a face of a microelectronic element and at least one of the first ends of the first conductive vias or the second conductive vias matching a spatial distribution of circuit contacts exposed at a face of at least one of the circuit panel and the package substrate.

6. The interconnection component of claim 5, wherein the first ends of the first conductive vias are usable to bond the interconnection component to a microelectronic element, and wherein the first support portion has a CTE greater than or equal to a CTE of the microelectronic element and less than or equal to a CTE of the second support portion.

7. The interconnection component of claim 6, wherein the first ends of the first conductive vias are usable to bond the interconnection component to the microelectronic element through first contacts exposed at the first surface of the first support portion, the first contacts overlying and connected with the first conductive vias.

8. The interconnection component of claim 5, wherein the first ends of the second conductive vias are usable to bond the interconnection element to the circuit panel or the package substrate, and wherein the second support portion has a CTE that greater than or equal to the CTE of the first support portion.

9. The interconnection component of claim 8, wherein the first ends of the second conductive vias are usable to bond the interconnection component to the circuit panel or package substrate through second contacts exposed at the first surface of the second support portion, the second contacts overlying and connected with the second conductive vias.

10. The interconnection component of claim 1, wherein the first and second support portions have a coefficient of thermal expansion ("CTE") of less than 12 parts per million per degree, Celsius ("ppm/° C.").

11. The interconnection component of claim 10, wherein the first support portion has a CTE ranging from 3 to 6 ppm/° C. and wherein the second support portion has a CTE ranging from 6 to 12.

12. The interconnection component of claim 1, wherein the first conductive vias are spaced apart relative to each other at a first pitch, wherein the second conductive vias are spaced apart relative to each other at a second pitch that is greater than the first pitch.

13. The interconnection component of claim 1, wherein the redistribution layer further includes:
a dielectric layer; and
routing circuitry embedded in the dielectric layer and including third conductive vias extending at least partially through the dielectric layer, the routing circuitry electrically connecting at least some of first conductive contacts with at least some of second conductive contacts;
wherein a smallest pitch of the third conductive vias is greater than a largest pitch of the first conductive vias and less than a smallest pitch of the second conductive vias.

14. The interconnection component of claim 1, wherein the redistribution layer includes first and second portions, the first portion including the first surface and the first conductive contacts, the second portion including the second surface and the second conductive contacts, wherein each of the first and second portions further includes an intermediate surface and intermediate contacts, wherein the intermediate surfaces face each other and the intermediate contacts are joined together.

15. The interconnection component of claim 14, wherein the intermediate contacts are joined together using conductive masses, the component further comprising an underfill between the intermediate surfaces, the underfill filling spaces between individual ones of the conductive masses.

16. The interconnection component of claim 14, wherein the intermediate contacts are fused together and dielectric material exposed at the intermediate surfaces is fused together.

17. The interconnection component of claim 1, wherein a smallest pitch of the first conductive vias is smaller than a smallest pitch of the second conductive vias.

18. The interconnection component of claim 1, further including a passive device positioned between the first surfaces of the first and second support portions and electrically connected with one or more of the first conductive vias, the second conductive vias, the first contacts and the second contacts.

19. The interconnection component of claim 18, wherein the passive device is disposed between the second surfaces of the support portions.

20. The interconnection component of claim 18, wherein the passive device is disposed between the first and second opposed surfaces of one of the first or second support portions.

21. The interconnection component of claim 19, wherein the passive device is disposed between the second surface of one of the support portions and the first surface of the other of the support portions.

22. The interconnection component of claim 1, wherein at least one of the first and second support portions includes glass.

23. A microelectronic assembly, including:
the interconnection component of claim 1; and
a first microelectronic element having element contacts at a face thereof;
wherein the first ends of the first vias match a spatial distribution of the element contacts of the microelectronic element, and the element contacts are joined with the first ends of the first vias through masses of conductive bonding material.

24. The microelectronic assembly of claim 23, further including a second microelectronic element having element contacts thereon, wherein an extension of the second support portion extends beyond an edge of the first support portion, the second microelectronic element being mounted on the extension and electrically connected with ones of the first vias that are exposed on the extension.

25. The microelectronic assembly of claim 24, further comprising wire bonds, the wire bonds electrically interconnecting the second microelectronic element with ones of the first vias that are exposed on the extension.

26. The microelectronic assembly of claim 24, further comprising second wire bonds, the second wire bonds connecting ones of the first vias exposed on the extension with some of the circuit contacts.

27. The microelectronic assembly of claim 23, further including a substrate having circuit contacts formed at a surface thereof, the second conductive vias being electrically connected with the circuit contacts.

28. The microelectronic assembly of claim 27, wherein the second support portion has second contacts exposed at the first surface thereof and electrically connected with the second conductive vias, wherein the second contacts are joined to the circuit contacts.

29. A system comprising:
  the microelectronic assembly according to claim 23 and one or more other electronic components electrically connected to the microelectronic assembly.

* * * * *